INVENTOR.
WILLIAM A. REIMER
BY Spencer E. Olson
ATTY.

April 28, 1970 W. A. REIMER 3,508,919

MASTER ARTWORK TECHNIQUE FOR PRODUCING PRINTED WIRING BOARDS

Filed June 13, 1966

7 Sheets-Sheet 6

1

3,508,919
MASTER ARTWORK TECHNIQUE FOR PRODUCING PRINTED WIRING BOARDS

William A. Reimer, Wheaton, Ill., assignor to Automatic Electric Laboratories, Inc., Northlake, Ill., a corporation of Delaware Filed June 13, 1966, Ser. No. 556,969
Int. Cl. G03c 5/00
U.S. Cl. 96—36.2 7 Claims

ABSTRACT OF THE DISCLOSURE

A technique for the preparation of artworks for use in the manufacture of printed wiring boards with different layouts of conductors and interconnection pads. In this technique the critical dimensions for conductors and pads are established by a dimensionally accurate artwork while the unique conductor routings and the locations of the pads actually used for each unique board are established by a different artwork which can be less accurate. The two artworks are overlaid in contact with each other and opaque material, such as tape, corresponding to the unique pattern is applied to the top sheet of the stack formed.

This invention relates to the manufacture of printed wiring boards and in particular to a method for producing artworks used in the derivation of board conductor patterns.

The production of artworks for use in the manufacture of printed wiring boards is a major factor in the cost of each board. One reason the development of artworks is expensive is that each artwork is unique to a particular functional board that may be used in various places in a system, but never be produced in quantity.

The first step in the development of an artwork is to plan the locations for conductors and pads and then to make a pencil layout of these conductors and pads. Then the wiring pattern shown in the layout is converted to an artwork layout using a light table and duplicating the layout by selective application of tape on Mylar film or by using a coordinatograph while cutting away portions of a strippable film. This conversion operation has two major problems associated with it. First, the finished board's wiring pattern accuracy and plated-through hole pattern alignment are "built-in" at this point so the artwork must be very accurate and, in most instances, it is essential that a coordinatograph be employed. Oversized artworks are normally produced so that tolerances are reduced when the artwork is photographically reduced to full size. The other problem is that in a pattern, the mounting pads all look alike and it is very easy to terminate a conductor at the wrong pad. One improperly connected conductor may cause a number of conductors to be improperly terminated because the first pad in a group that has a conductor terminated to it is generally used as a reference point for all other terminations in the group. An error in the artwork may be caught when the artwork is checked or may not be caught until the board is produced and the circuit tested. Regardless of where an artwork error is caught, the time required to make the correction will result in an additional cost.

A somewhat different approach to the development of accurate artworks has been disclosed in U.S. Patent 3,233,509 to R. L. Swiggett. The method of this patent includes the steps of projecting simultaneously an accurate reference pattern of grid markings and an inaccurate representation of a printed circuit pattern onto a screen through a lens, and applying to the screen an opaque adhesive tape with the tape being positioned with respect to the grid and conductor patterns being projected

2 onto the screen. The master grid indicates potential conductor and pad locations but the critical dimensions of the conductors and pads are determined by the tape applied to the screen. The resulting artwork is then photographically reduced to full size. While the method disclosed in this patent has eliminated the need for using enlarged layouts and also the need to use a light table to transfer the layout to Mylar film, a projector must be used during the formation of each artwork.

Therefore according to this invention, the time and cost required to produce artworks for unique printed wiring boards as well as the amount of apparatus required for the production of each unique artwork is greatly reduced by a technique where the critical dimensions for conductors and pads are established by a dimensionally accurate artwork while the unique conductor routings and the locations of the pads actually used for each unique board are established by a different, less accurate artwork.

Since a given component has known lead spacings and since a given distance is normally maintained between components, the optimum mode of interconnections for all such components can then be described as a predetermined pattern of mounting pads with a known maximum possible number of conductor paths routing around them.

The pattern of pads and their locations are known so an artwork layout of these units can be made. With minimum conductor widths and spacings established for a given system of boards all possible conductor paths can be shown on the same layout artwork with the pads. This master layout artwork shows all of the possible wiring features for printed wiring boards of the system, and can be used by an engineer, technician, or draftsman to establish conductor routings and the pads used on a particular board. The layout is unique, but the master artwork is used in forming all the layouts. The master artwork is no more than a special drafting aid that increases the layout accuracy of a person making a unique artwork without the use of a coordinatograph.

Accordingly, it is an object of this invention to provide a new and improved method for preparing artworks for use in the manufacture of printed wiring boards.

It is yet another object to minimize layout errors, reduce costs and minimize the time required to produce printed wiring boards.

Briefly, according to the invention, a preferred embodiment for preparing artworks for use in the manufacture of printed wiring boards having different layouts of conductors and interconnection pads includes the steps of making a master layout artwork by providing on a first sheet of transparent material, a pattern of clear and opaque areas which define the physical outlines of all possible conductors as well as interconnection pads; making a master layout sheet by obtaining a print of the master layout artwork; adapting the master layout sheet to a unique board layout by designating on the layout sheet predetermined conductors and pads; and making a unique layout artwork by laying a second sheet of transparent material over the master layout sheet and depositing opaque material on the second sheet in correspondence with the predetermined conductors and pads.

In the production of printed wiring boards, one master layout artwork is used to establish the critical dimensions for the conductors and pads for all of the boards and a separate unique layout artwork, derived from the master artwork, is used to establish conductor routings and to select the pads that are required for each unique board.

A master layout artwork and a unique layout artwork may be combined photographically to produce a single, dimensionally accurate, unique layout artwork.

Furthermore, according to the invention after a copper-clad board has been photosensitized, it can be selectively exposed to light in a multiple-step exposure operation. During one of the exposure steps, a mask derived from a master layout artwork is held in intimate contact with the board and a pattern that corresponds to all possible conductors and pads is established by exposing all unmasked areas to light. During another one of the exposure steps, a mask derived from a unique layout artwork is used to expose all unwanted conductors and pads to light so that only the locations of the required conductors and pads are unexposed.

These and other objects and features will become more apparent from the following detailed description which makes reference to the accompanying drawings, in which.

Figure 1:
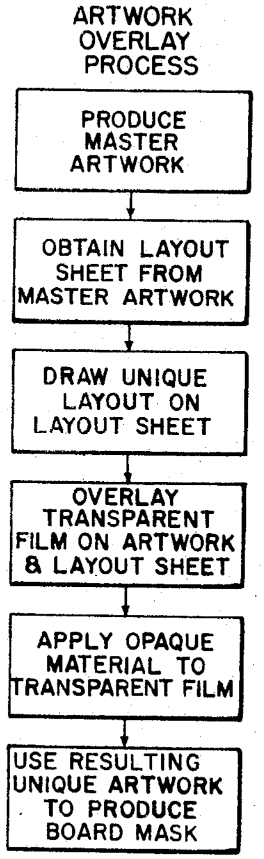
FIG. 1 is a flow chart for the artwork overlay process.
Figure 5:
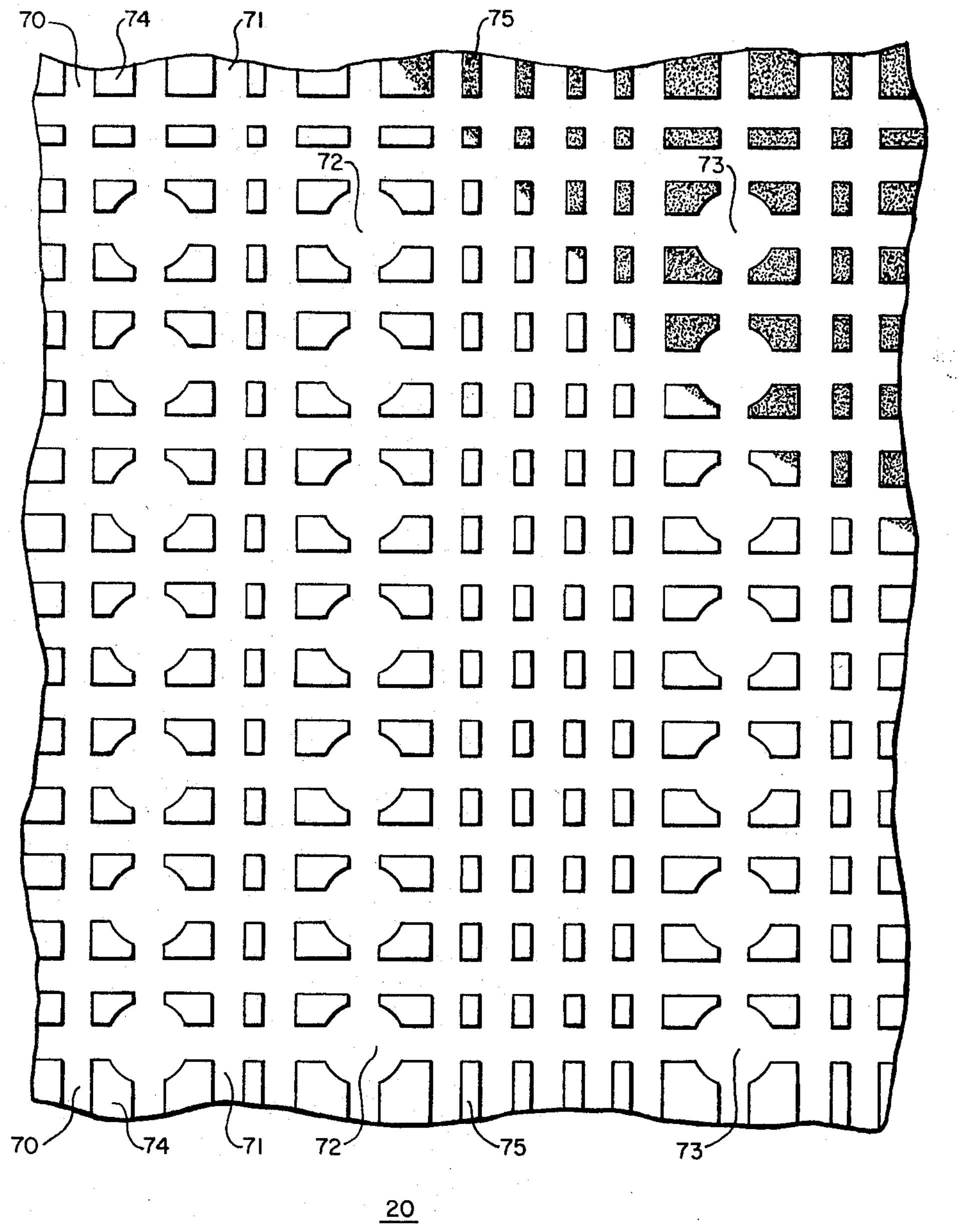
FIG. 5 is a portion of a master layout artwork.

Referring now to the drawings, FIG. 1 is a flow chart for the artwork overlay process, a preferred method for producing artworks for printed wiring boards according to this invention. The first step of the process is to produce a master layout artwork 20, a portion of which is shown in FIG. 5. The artwork comprises a thin sheet of a stable material, such as a Mylar film, having a detailed pattern of clear and opaque areas which are formed in a manner known in the art such as by selective application of tape, or by selectively removing portions of a strippable film. For clarity, FIGS. 5, 6, 12 and 13 have been partially shaded. The clear and opaque areas accurately define the physical outlines of conductor paths and interconnection pad locations. Clear areas such as 70, 71 and 72, 73 correspond to these paths and locations while opaque areas such as 74 and 75 correspond to the spacings between adjacent conductors and pads. The pattern of pads and their locations as well as the number of conductors routing around them can be determined from the particular application and are dictated by system requirements and component lead spacings. With minimum conductor widths and spacing established for the system, all possible conductor paths can be shown on the master layout artwork together with the location of all available pads.

The master artwork is used to establish the critical dimensions of the conductors and the pads, and since the accuracy of the conductor pattern of the completed board is mainly dependent on the accuracy of the master artwork, the artwork is preferably produced on an X–Y table such as the coordinatograph.

If the pattern of pads and conductor paths on the master artwork is symmetrical, it is possible to generate the master artwork by first producing an unrepetitive portion of the pattern on the coordinatograph and then photographically copying this portion to provide the complete artwork. This technique minimizes the drafting time required to produce the master artwork and also reduces production costs The master artwork is not related to any unique layout, but rather is used to establish accurately, the dimensions of conductors and pads for all boards in a given system.

Figure 11:
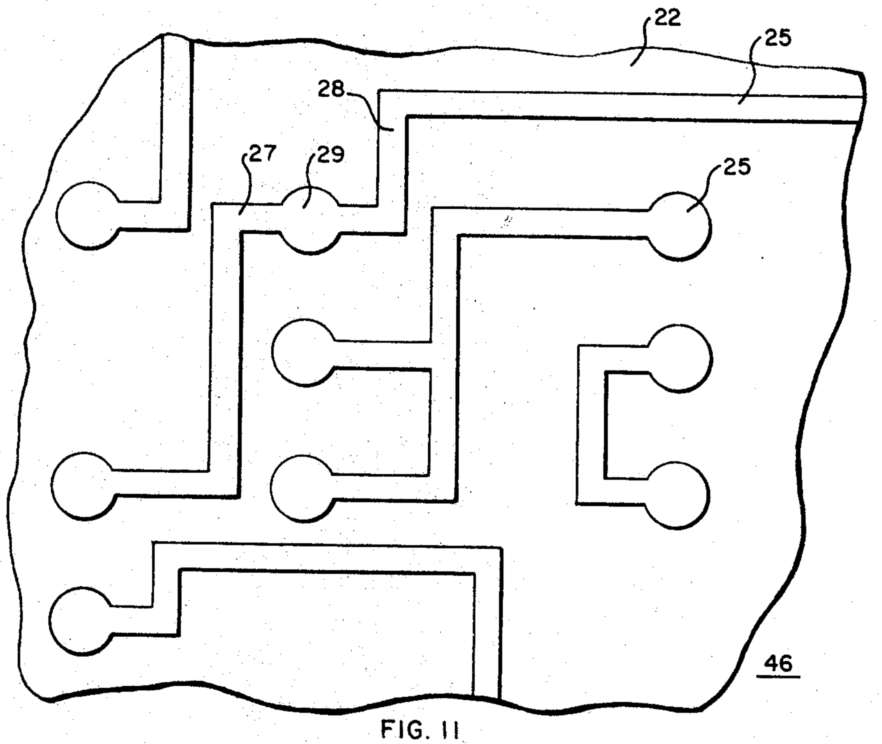
FIG. 11 is a portion of a unique layout artwork.
Figure 12:
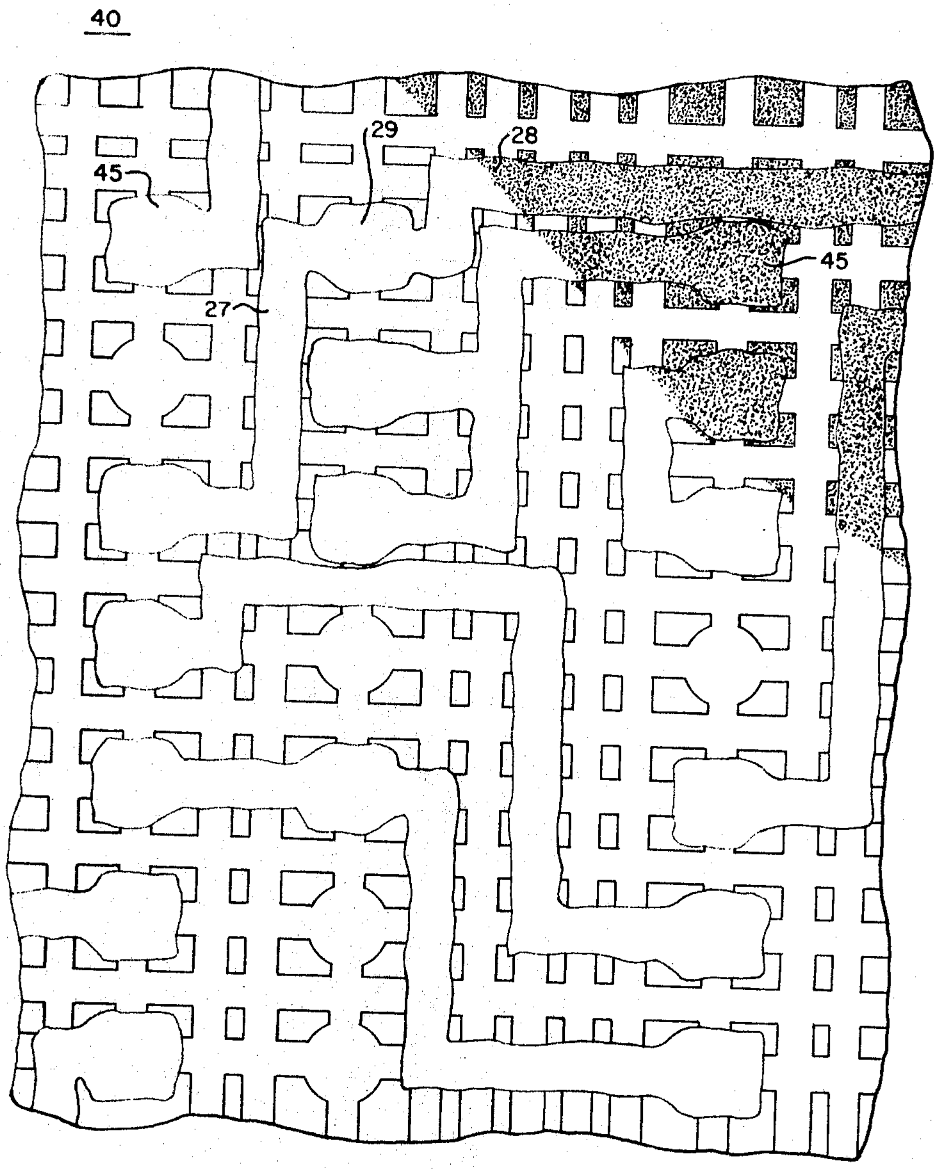
FIG. 12 is a portion of an opaqued master layout artwork.

The routings of conductors and the choice of pads to be used are established on a separate unique artwork such as the one referenced 46, a portion of which is shown in FIG. 11 or the one referenced 40, a portion of which is shown in FIG. 12, derived from the master layout artwork. The unique artwork defines the conductors and pads to a relatively lesser degree of accuracy than that used in defining the physical dimensions of the conductors on the master artwork. Although the unique artwork can be produced rapidly by hand and without the aid of a coordinatograph, the pattern of conductors and pads that will be established on the board is as accurate as it would have been if the unique artwork had been produced on the coordinatograph because the critical dimensions are established by the master artwork.

The accuracy of the printed pattern can be further increased by making both artworks in an oversized scale preferably 4:1. However, both artworks are drawn to the same scale. When the completed artwork is photographically reduced to full size to obtain a suitable mask, the tolerances are also reduced on the same scale.

Figure 6:
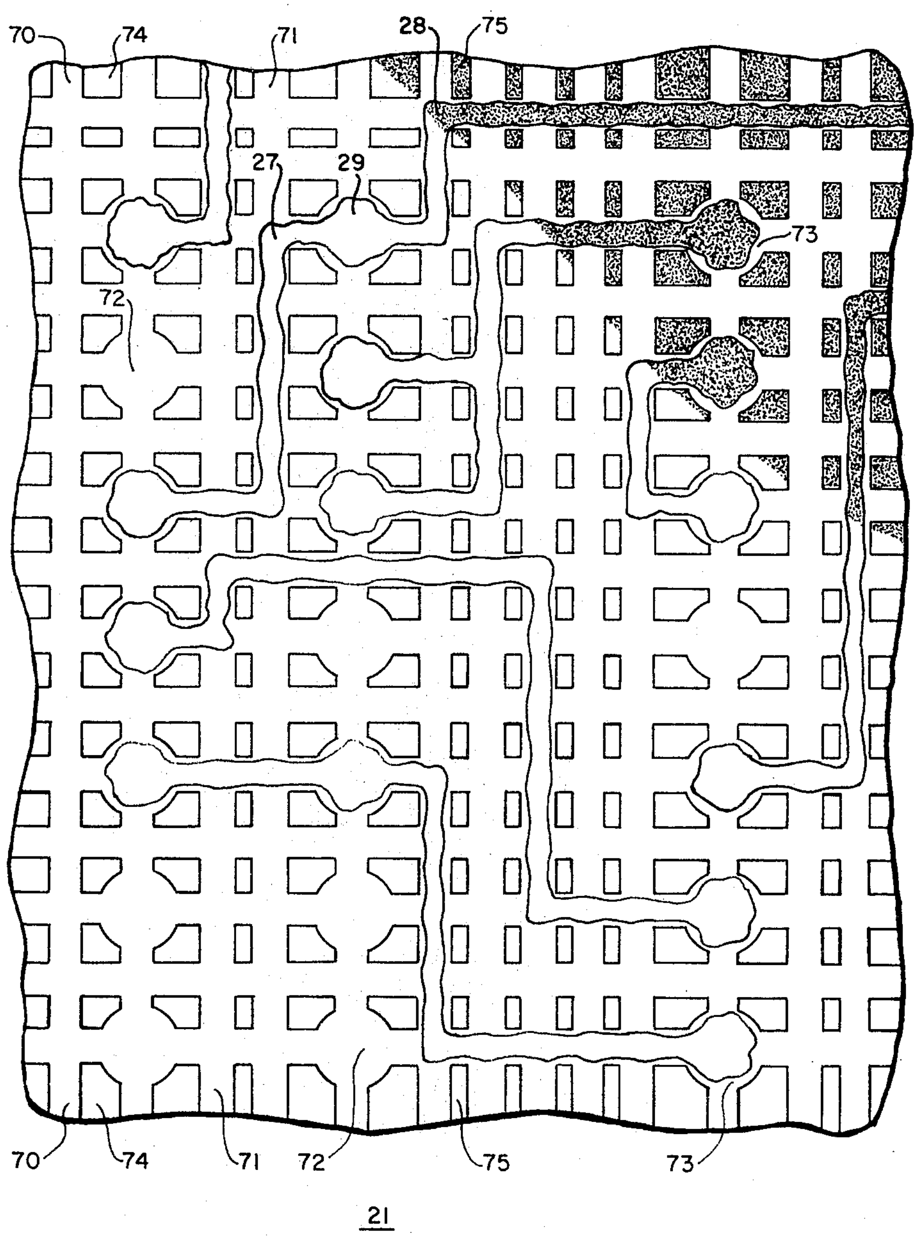
FIG. 6 is a portion of a master layout sheet having a unique layout.

Referring again to FIG. 1, after the master layout artwork is produced, a master layout sheet 21, a portion of which is shown in FIG. 6, is obtained by making a print of the master layout artwork. The master layout sheet is used to simplify the establishment of a layout of conductors and interconnection pads for a unique board and can also be used to generate a master control tape so that all of the holes that are required can be drilled on a tape-controlled drilled press. The desired layout is obtained by "pencilling-in" areas on the master layout sheet which correspond to the location of required conductors such as 27, 28 and a pad such as 29.

Figures 7, 8, 9:
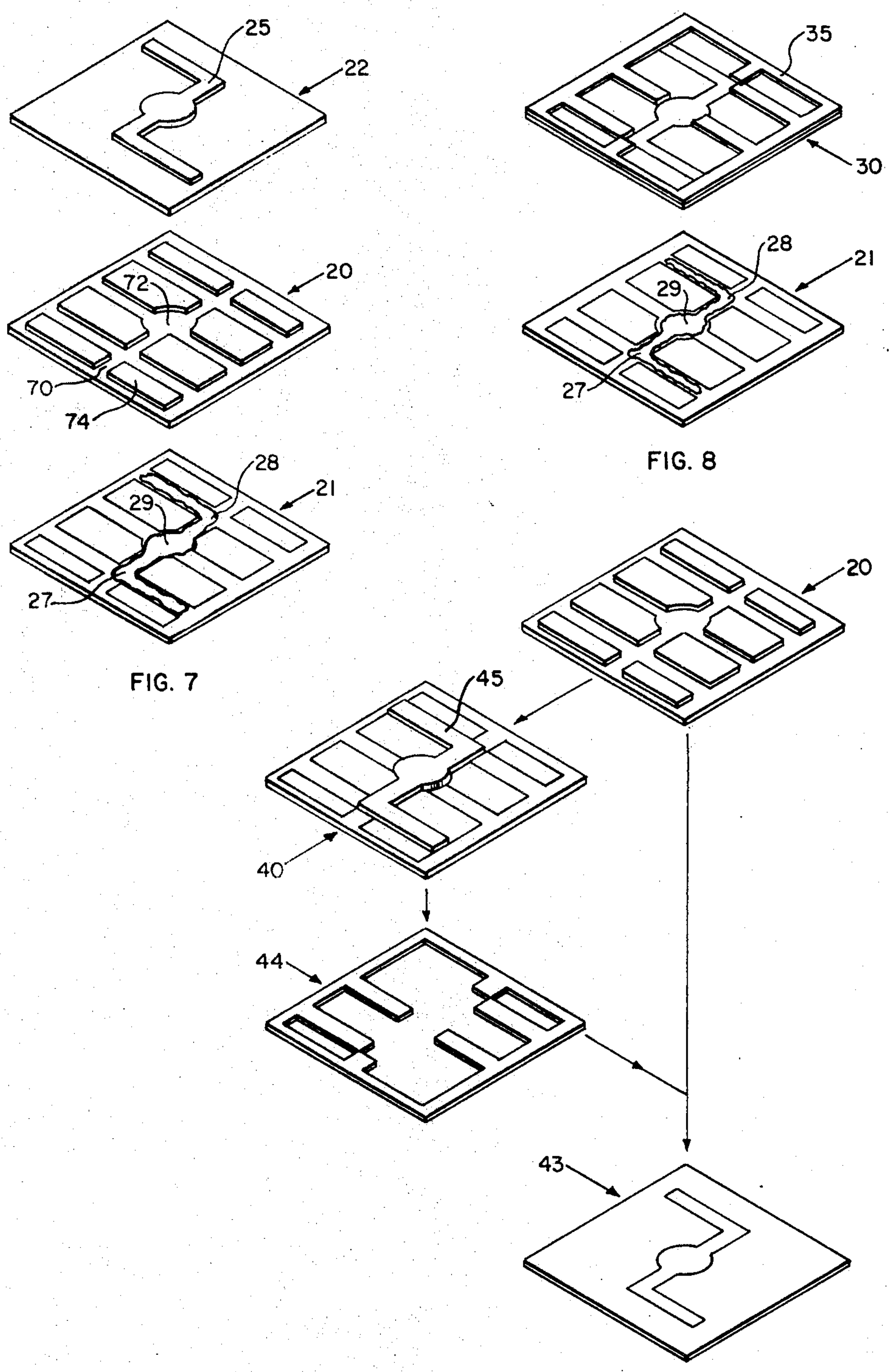
FIG. 7 is a simplified representation for the artwork overlay process.
FIG. 8 is a simplified representation for the direct opaquing process.
FIG. 9 is a simplified representation for the photographic process.

Referring to FIG. 7 which is a simplified sketch of the technique by which the unique artwork is made, the master artwork 20 and the master layout sheet 21 are used as underlays and the unique conductor pattern is transferred to a sheet of transparent material 22, preferably a Mylar film serving as the unique artwork substrate. The master artwork is used to simplify the process by which the conductive pattern drawn on the master layout sheet is transferred to the Mylar sheet. Opaquing material 25, such as tape which is preferably cut in the shape of pads of the required diameter or conductors of the required lengths and widths, is deposited on the unique artwork substrate in correpsondence with the "pencilled-in" areas of the master layout sheet. This direct transfer technique helps to minimize layout errors. The tape that is applied is preferably narrower than the clear areas provided on the master artwork so that there is a clear zone between the tape laid down and the opaque material forming the conductor path boundaries on the master artwork. In this way, the placement of tape is less critical. The tape that is applied may be as wide as the clear areas provided on the master artwork to guide the placement of the tape. In this case, some care would have to be taken to insure that the tape was laid down within the boundaries established by the opaque material on the master artwork.

A portion of the unique layout artwork 46 that results is shown in FIG. 11. Opaque material has been deposited at various locations on the film 22 to designate, for instance, conductors 27 and 28 and pad 29. The unique layout artwork is photographically reduced and the pattern image is reproduced on a material, such as a heavy Mylar film or glass, that is suitable for use as a mask to selectively expose the photosensitized surfaces of a printed wiring board to permit the establishment of the desired conductor pattern. A supplemental artwork (not shown) is used to provide a pattern of connector tabs adjacent one edge of the unique layout artwork before it is photographically reduced.

Figure 2:
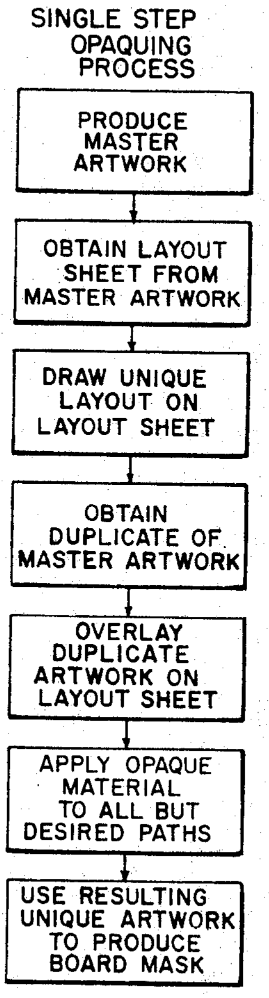
FIG. 2 is a flow chart for the single-step opaquing process.

FIG. 2 is a flow chart for the single-step opaquing process, an alternative to the artwork overlay process for producing artworks. A master layout artwork 20, FIG. 5, is formed and a unique layout is established on a master layout sheet 21, FIG. 6. Referring to FIG. 8, a unique artwork is formed by applying a suitable opaquing material 35, such as tape, paint, or ink, directly to a photographic duplicate 30 of the master artwork, with the master layout sheet 21 being used as an underlay in forming the pattern on the artwork. The opaquing material is deposited so that it covers all of the clear portions of the artwork duplicate with the exception of those areas that have been "pencilled-in" or the underlying layout sheet 21. The covered portions thus correspond to the paths of unused conductors and pads, whereas the remaining clear pattern on the unique artwork corresponds to the desired conductor pattern. The unique artwork is then processed to obtain a suitable mask in the same manner as in the artwork overlay process.

Figure 3:
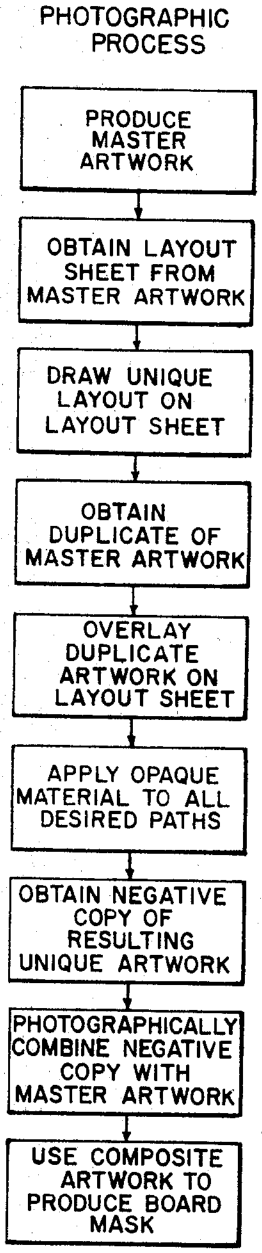
FIG. 3 is a flow chart for the photographic process.

FIG. 3 is a flow chart for the photographic process, a second alternative to the artwork overlay process. The master artwork 20 and layout sheet 21 are prepared as in FIG. 7 and, referring to FIG. 9, the unique conductor pattern is transferred from the layout sheet (not shown), which is used as an underlay, to a photographic duplicate 40 of the master artwork 20 by depositing opaque material 45 on the artwork duplicate in correspondence with the conductor pattern drawn on the layout sheet. In this process, in contrast to that shown in the upper portion of FIG. 8, the opaque material is deposited only on those clear areas that overlie areas "pencilled-in" on the layout sheet. A portion of the artwork 40 having portions so opaqued which correspond, for instance, to conductors 27 and 28 and pad 29 is shown in FIG. 12. The opaque material, collectively referenced 45 in FIGS. 9 and 12, which merely designates the location of the required pads and establishes the desired conductor routings, can be applied with a minimum amount of accuracy. While the clear areas on the artwork duplicate 40 that correspond to the conductor must be completely covered, the material applied may extend onto the opaqued portions of the artwork duplicate, as indicated in a somewhat exaggerated way in FIG. 12.

After the desired wiring pattern has been opaqued on the duplicate master artwork, a negative 44 of the opaqued artwork 40 is obtained photographically. The master artwork negative 44 and the master artwork original 20 are then combined photographically to form a unique artwork 43 which in turn is used to produce a mask that can be used in the derivation of a unique conductor pattern on a board.

Figure 4:
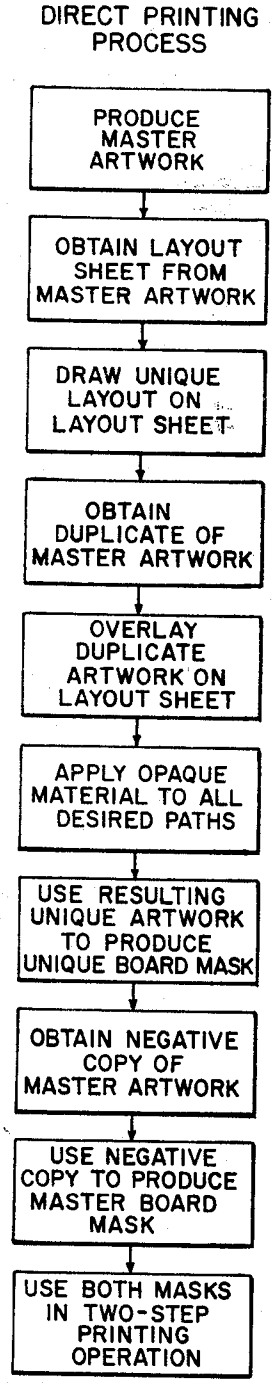
FIG. 4 is a flow chart for the direct printing process.
Figure 13:
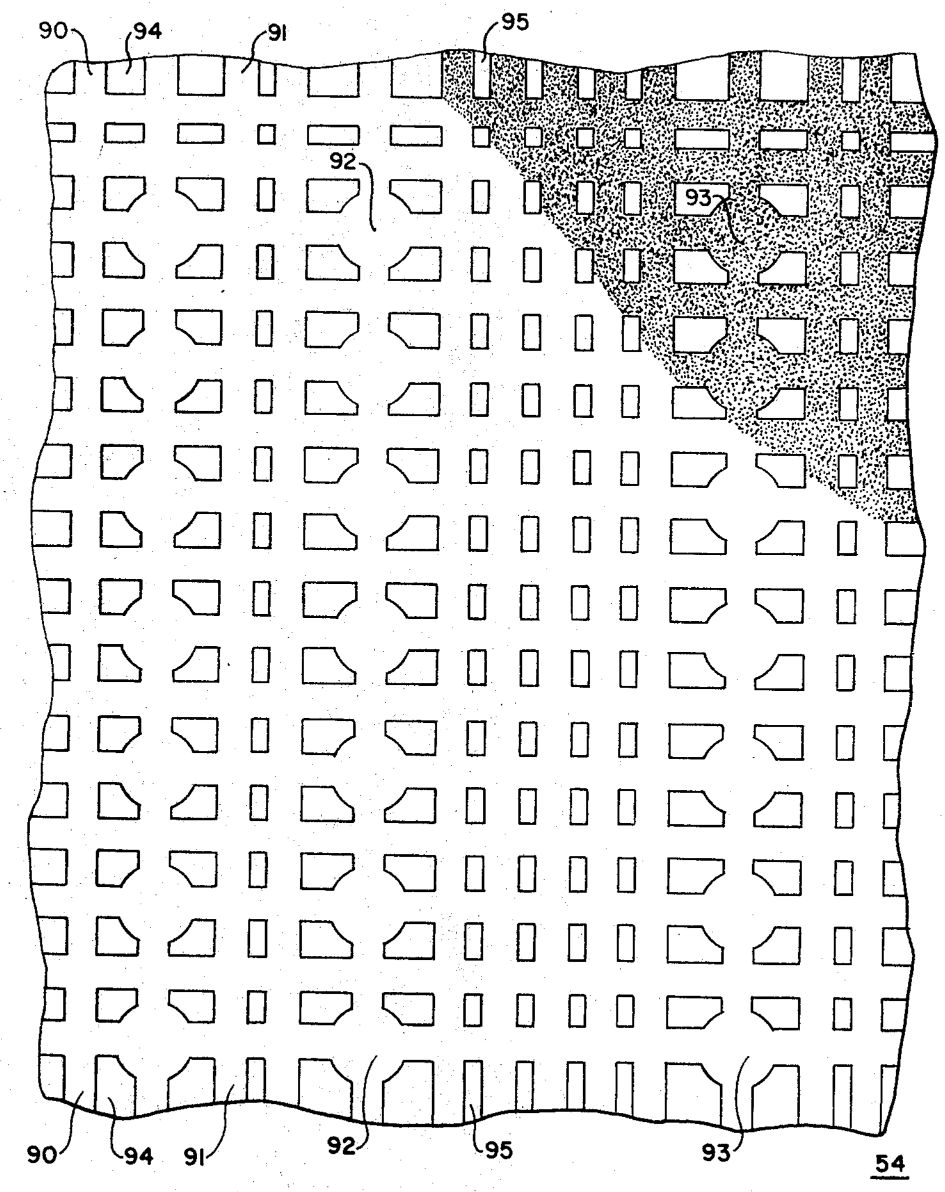
FIG. 13 is a portion of a master board artwork.

FIG. 4 is a flow chart for the direct printing process, a third alternative to the artwork overlay process. A master layout artwork and a master layout sheet are prepared and a unique layout is drawn on the layout sheet, all as previously described. The unique layout is opaqued on a duplicate master artwork in the manner described in the photographic process, FIGS. 3 and 9, to provide a unique layout artwork 58. In addition, a master board artwork 54, such as the one shown in detail in FIG. 13 is produced by making a negative copy of the master layout artwork 20. This is schematically indicated in the top portion of FIG. 10. Opaque areas such as 90, 91 and 92, 93 correspond to conductor paths and pad locations while clear areas such as 94 and 95 correspond to the spacings between adjacent conductors and pads. The master board artwork shows all possible conductors and pads and is used to establish the critical dimensions and locations on the finished unique board. The two artworks 58 and 54 are used to produce, respectively a master layout mask and a unique layout mask which, as described below, in turn are used to derive conductor patterns. In the schematic drawing of FIG. 10 it has been assumed that artworks 58 and 54 themselves are used as master layout mask and unique layout mask, respectively. This would in fact, be possible if full scale artworks were employed.

Rather than being produced photographically from the master artwork 20, the master board artwork 54 may be produced on a coordinatograph and the conductors and pads may be made undersized with respect to those of the master layout artwork. This would simplify the alignment of the two artworks when they are used together to form a single unique conductor pattern.

Figure 10:
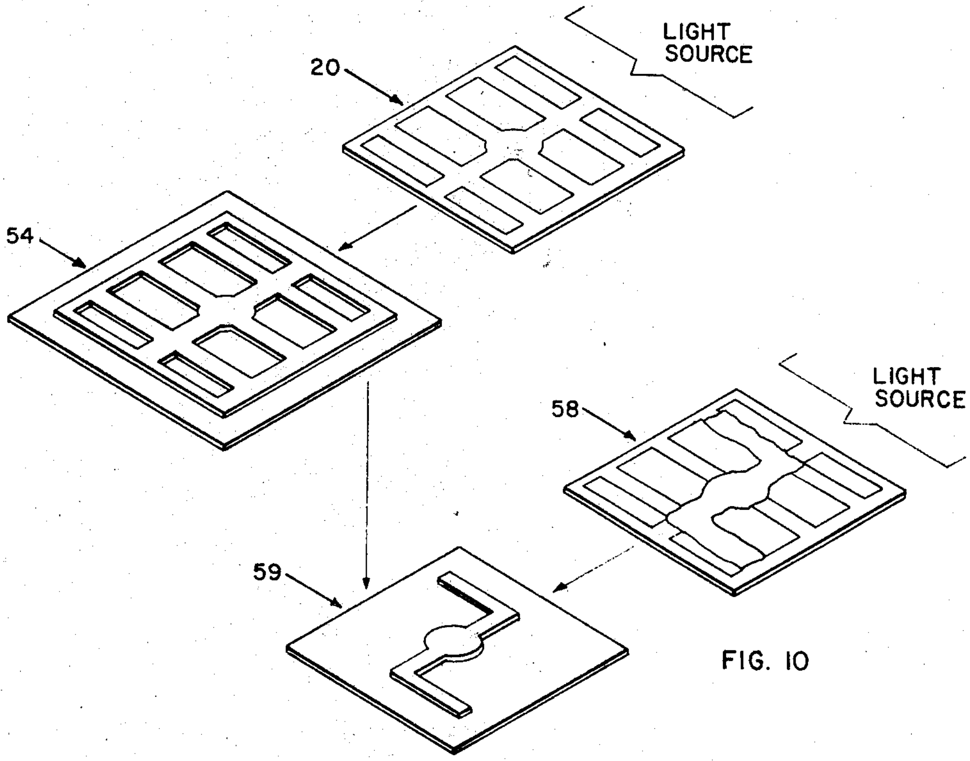
FIG. 10 is a simplified representation for the direct printing process.

Referring to FIG. 10, the board mask 54 and the unique layout mask 58 are used in a two-step printing operation. First, a copper-clad photosensitized board 59 is exposed to light while the master board mask 54 is held in intimate contact with the board surface. The pattern that would be printed on the board, at this point if the board were developed and etched would correspond to all possible pads and conductors. The conductors formed would be of the desired tolerance because of the accuracy of the master board artwork. However, after the board has been exposed to light through the first mask 54, it is again re-exposed while masked only with the unique mask 58. Only the desired pads and conductor routings have been opaqued, and those areas not opaqued will be subjected to light the same as the unused areas on the board had been in the exposure with the master board mask. As a result, only the desired conductive paths and pads have been masked during the exposures.

The above invention has been described by way of a preferred embodiment, however, it is to be understood that this was done merely by way of example and not intended as a limitation to the spirit and scope of the invention as only defined by the following claims.

What is claimed is:

1. A method of manufacturing printed wiring boards having different layouts of conductors and interconnection pads;

said method comprising the preparation of a unique pattern for use in this manufacture by the steps of:

providing a plurality of sheets, said sheets including a bottom sheet showing all possible conductors and all possible interconnection pads, and one or more additional sheets all of transparent material, one said additional sheet having a cross-coordinate array of clear and opaque areas accurately defining the outer limits of the physical contours of all said possible conductors and of all said possible interconnection pads over the entire extent of each said conductor and pad, selectively designating on said bottom sheet the predetermined ones of said conductors and interconnection pads which are to be printed on said board, overlaying said bottom sheet with at least said one additional sheet in mutually aligned relationship to form a stack, and depositing opaque material on the top sheet of said stack to form said unique pattern, said pattern representing only the predetermined conductors and pads designated by said bottom sheet.

2. A method as claimed in claim 1 wherein said bottom sheet is derived from said one additional sheet.

3. A method as claimed in claim 1 wherein said additional sheets include a sheet separate from and overlaid on said one additional sheet, the physical outlines of the predetermined conductors and pads on said separate sheet being opaqued by relating said outlines to the contours of the opaque areas on said one additional sheet.

4. A method as claimed in claim 1 wherein said opaque material is deposited on said top sheet of said stack to form a negative image of the predetermined conductors and pads.

5. A method as claimed in claim 1 and further including the steps of making a photographic negative of said top sheet and photographically combining said negative with said one additional sheet.

6. A method as claimed in claim 1 and further including the steps of deriving a first mask from said top sheet, deriving a second mask from said bottom sheet and exposing a photo-sensitized surface of a board to light with said surface masked by one of said masks and then re-exposing said surface to light with said surface masked by the other mask.

7. A method of preparing artworks for use in the manufacture of printed wiring boards having different layouts of conductors and interconnection pads;

said method comprising:

making a master layout artwork by providing on a first sheet of transparent material a detailed pattern of clear and opaque areas which define accurately the physical outlines of all possible conductors as well as interconnection pads; and deriving from said master lay out artwork, a unique layout artwork, of the same scale as said master layout artwork, by depositing opaque material on a second sheet of transparent material in a predetermined pattern so as to define only the desired conductors and interconnection pads, the widths of the conductors and the dimensions of the pads defined on said master layout artwork being larger than the widths of the conductors and the dimensions of the pads defined on said unique artwork.

References Cited

UNITED STATES PATENTS

| | | | |
|---|---|---|---|
| 3,385,702 | 5/1968 | Koehler | 96—36.2 |
| 3,171,264 | 3/1965 | Balducci | 33—1 |
| 3,171,741 | 3/1965 | Meyer | 96—27 |
| 3,254,559 | 6/1966 | Swiggett | 88—24 |

GEORGE F. LESMES, Primary Examiner

M. B. WITTENBERG, Assistant Examiner

U.S. Cl. X.R.

96—27, 44; 117—35; 317—101